(12) United States Patent
St. Onge et al.

(10) Patent No.: US 8,648,616 B2
(45) Date of Patent: Feb. 11, 2014

(54) LOADED PRINTED CIRCUIT BOARD TEST FIXTURE AND METHOD FOR MANUFACTURING THE SAME

(75) Inventors: Gary F. St. Onge, Ballston Lake, NY (US); Scott F. Gold, Albany, NY (US); Matthew T. Miczek, Saratoga Springs, NY (US)

(73) Assignee: LTX-Credence Corporation, Norwood, MA (US)

( * ) Notice: Subject to any disclaimer, the term of this patent is extended or adjusted under 35 U.S.C. 154(b) by 407 days.

(21) Appl. No.: 12/963,322

(22) Filed: Dec. 8, 2010

(65) Prior Publication Data

US 2011/0148448 A1  Jun. 23, 2011

Related U.S. Application Data

(60) Provisional application No. 61/289,339, filed on Dec. 22, 2009.

(51) Int. Cl.
*G01R 1/067* (2006.01)
(52) U.S. Cl.
USPC .................................. 324/755.01
(58) Field of Classification Search
USPC .................................. 324/755.01
See application file for complete search history.

(56) References Cited

U.S. PATENT DOCUMENTS

| | | | |
|---|---|---|---|
| 5,187,671 A | 2/1993 | Cobb | |
| 5,216,361 A | 6/1993 | Akar et al. | |
| 5,493,230 A | 2/1996 | Swart et al. | |
| 5,633,598 A | 5/1997 | Van Loan et al. | |
| 5,663,655 A | 9/1997 | Johnston et al. | |
| 5,818,248 A | 10/1998 | St.Onge | |
| 5,898,314 A | 4/1999 | Swart | |
| 5,945,838 A * | 8/1999 | Gallagher et al. | 324/750.25 |
| 6,191,597 B1 * | 2/2001 | Driller et al. | 324/750.25 |
| 6,194,908 B1 * | 2/2001 | Wheel et al. | 324/756.04 |
| 6,259,963 B1 * | 7/2001 | Naomachi | 700/121 |
| 6,285,205 B1 * | 9/2001 | Creeden | 324/755.11 |
| 7,913,221 B2 * | 3/2011 | Miyashita et al. | 716/139 |
| 2001/0050571 A1 * | 12/2001 | Johnston | 324/761 |
| 2003/0206031 A1 * | 11/2003 | Harris | 324/758 |
| 2004/0012401 A1 * | 1/2004 | King et al. | 324/754 |

(Continued)

OTHER PUBLICATIONS

Advance E-Mail PCT Notification with International Preliminary Report on Patentability for International Application No. PCT/US2010/061376; date of issuance Jun. 26, 2012; date of mailing Jul. 5, 2012; 9 pages.

(Continued)

*Primary Examiner* — Jermele M Hollington
*Assistant Examiner* — Demetrius Pretlow
(74) *Attorney, Agent, or Firm* — Christie, Parker & Hale, LLP

(57) ABSTRACT

A test fixture for testing loaded printed circuit boards having a plurality of test points having a probe plate including an array of widely spaced high force spring test probes in compliant contact with solid translator pins located in a translator fixture removably positioned over the probe plate. The test fixture includes optimization software wherein translation of the test signals are optimized by providing the shortest interconnect distance in the x-y plane between the test points on the printed circuit board and the test probes in the probe plate. The fixture further includes an unpowered opens device for testing components on the loaded printed circuit board.

12 Claims, 10 Drawing Sheets

(56) References Cited

U.S. PATENT DOCUMENTS

2004/0036465 A1* 2/2004 Siefers et al. .............. 324/158.1
2005/0093552 A1* 5/2005 Ahrikencheikh ............. 324/500
2006/0151444 A1* 7/2006 Miczek et al. ............. 219/121.6
2007/0013383 A1* 1/2007 Parker et al. ................. 324/519
2010/0045324 A1* 2/2010 Beaman et al. ............... 324/758

OTHER PUBLICATIONS

International Search Report and Written Opinion for International Application No. PCT/US2010/061376, date of mailing Mar. 1, 2011, search completed Feb. 4, 2011, 9 pages.

* cited by examiner

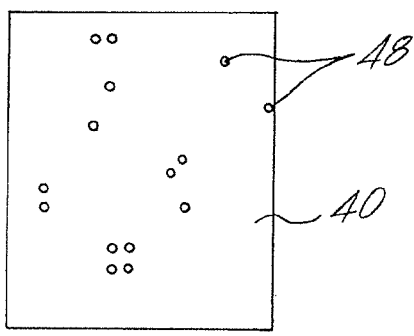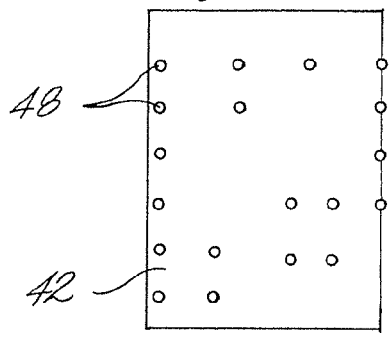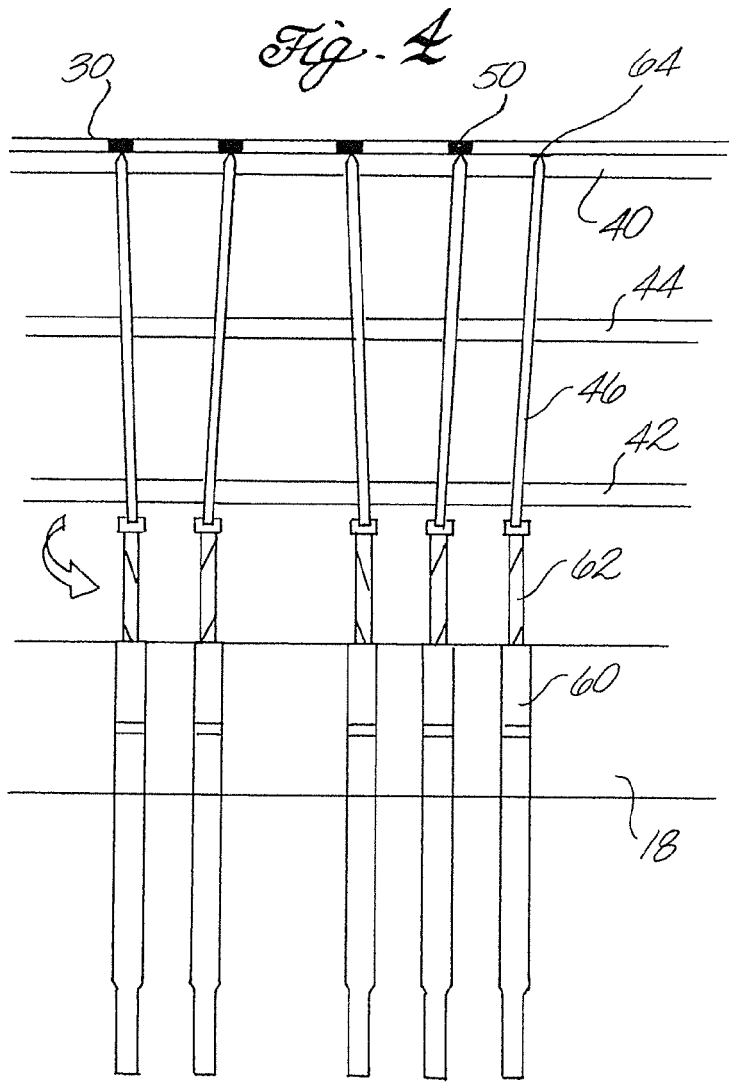

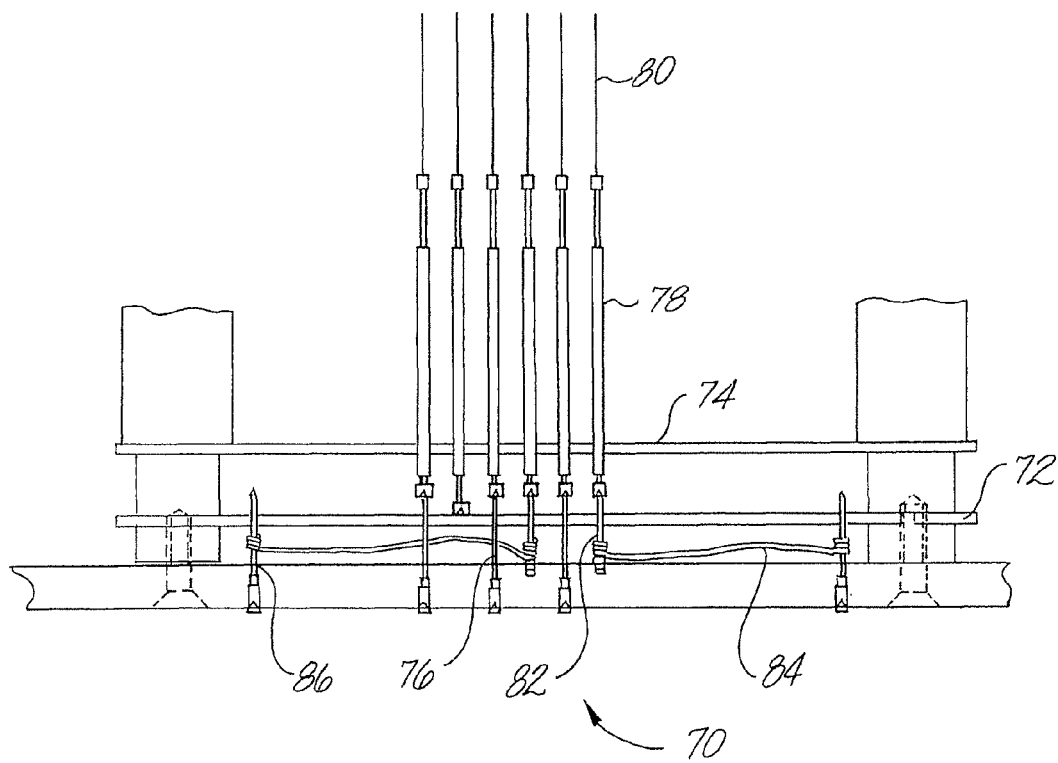

LOADED PRINTED CIRCUIT BOARD TEST FIXTURE AND METHOD FOR MANUFACTURING THE SAME

CROSS-REFERENCE TO RELATED APPLICATION(S)

This application claims priority to U.S. Provisional Application No. 61/289,339 filed Dec. 22, 2009, the contents thereof are incorporated herein.

BACKGROUND OF THE INVENTION

This invention relates to test fixtures for the automatic testing of loaded printed circuit boards, and more particularly to a test fixture utilizing a tilt pin translating fixture that contains an optimized translation for the test probes for testing high pitch density test patterns.

Automatic test equipment for checking printed circuit boards has long involved the use of a "bed-of-nails" test fixture to which the circuit board is mounted during testing. This test fixture includes a large number of nail-like, spring loaded test probes arranged to make electrical contact under spring pressure with designated test points on the circuit board under test (UUT). Any particular circuit laid out on a printed circuit board (PCB) is likely to be different from other circuits, and consequently, the bed-of-nails arrangement for contacting test points in a particular circuit board must be customized for that circuit board. When the circuit to be tested is designed, a pattern of test points to be used in testing is selected and a corresponding array of test probes is configured in the test fixture. This method typically involves drilling a pattern of holes in a probe plate to match the customized array of test probes and then mounting the test probes in the drilled holes in the probe plate. The circuit board is then mounted in the fixture, superimposed on the array of test probes. During testing, the spring loaded test probes are brought into spring pressure contact with the test points on the UUT. Electrical test signals are then transferred from the board to the test probes and then to the exterior of the fixture for communication with a high speed electronic test analyzer which detects continuity or lack of continuity between various test points and the circuits on the board.

Various approaches have been used in the past for bringing the test probes and the PCB under test into pressure contact for testing loaded printed circuit boards. One class of these fixtures is a wired test fixture in which the test probes are individually wired to separate interface contacts for use in transmitting test signals from the probes to the external electronically controlled test analyzer. These wired test fixtures were dedicated fixtures and are often referred to as "vacuum test fixtures" since a vacuum may be applied to the interior of the test fixture housing during testing to compress the circuit board into contact with the test probes. Customized wired test fixtures of similar construction also can be made by using mechanical means, other than vacuum, to apply the spring force necessary for compressing the board into contact with the probes during testing.

Another class of test fixtures for testing bare printed circuit boards is the so-called grid type fixture in which the test points on the test side of a board are contacted by flexible pins or tilt pins which can move or otherwise be positioned to contact the random pattern of test points on the board and transfer test signals from the board to sets of interface pins arranged in a grid pattern on the receiver. In these grid type testers, fixturing is generally less complex and simpler than the customized wired test fixtures because there is no need to individually hard wire the test probes to separate interface contacts for each differently configured circuit to be tested; but with a grid system, the grid interfaces and test electronics are substantially more complex and costly.

In a grid type fixture for bare circuit board testing, the wiring for the grid array remains constant, independent of the configuration of the particular circuit board. What does change, however, is what is referred to as the translator fixture. The translator fixture includes a bottom plate having a hole pattern corresponding to the grid pattern of openings in a standard pin grid array, and a top plate having a hole pattern corresponding to the random off-grid pattern of contact points to be tested on a printed circuit board. A number of electrically conductive translator pins (these can be flexible pins or rigid tilt pins) are mounted in the holes of the top and bottom plates. As the translator pins travel through the translator fixture, they are redirected by the hole patterns of the plates to provide individual conductive paths between the standard grid pattern and the off-grid pattern corresponding to the test points on the circuit board under test. Extreme contact accuracy can be achieved between the translator pin and the test pad on the PCB because the translator pin does not extend beyond the upper surface of the top plate. The top plate in effect can accurately direct the translator pin precisely to the test pad through the holes in the top plate. The construction of the grid type translator fixture is typically less labor intensive than the rewiring of test probes in a wired type test fixture, making it simpler to customize the fixture to accommodate PCB's with different test point patterns. Therefore, it is often desirable to use a grid type test fixture when testing printed circuit boards having various different shapes and/or configurations.

The present invention is directed to test fixtures for testing loaded circuit boards. A problem encountered with these types of fixtures for testing loaded circuit boards is the ability to test high density test points on the printed circuit board. Many PCB tests utilize fine pitch test points arrangements, i.e., a spacing of 50 mils or less between test points. However, spring probes suitable for fine pitch spacing on the probe plate do not have a spring force sufficient to provide good electrical contact with the test points on the PCB. The present invention overcomes this problem by translating a higher density probe arrangement at the interface between the test probes and the PCB under test into a wider-space probe arrangement, typically 100 mils on center, in the test fixture. Having a test probe pattern on the probe plate with a sufficiently wide spacing permits the use of heavy duty spring probes, commonly referred to as 100 mil spring probes, which deliver a greater spring force, providing better electrical contact. This force is translated through tilt pins, providing better electrical contact with a fine pitch test point arrangement on the PCB under test. One such loaded board test fixture is disclosed in applicant's U.S. Pat. No. 5,818,248, the disclosure of which is incorporated herein by reference.

However, a need exists for improvements in optimized translation of the tilt pins of the loaded board test fixture disclosed in the '248 patent, as well as the ability to test individual components of the UUT.

SUMMARY OF THE INVENTION

One embodiment of the invention comprises a vacuum, pneumatic or mechanical test fixture having a removable translator fixture for translating a wide-spacing probe pattern to a fine pitch test pattern. The wide-spacing probe pattern corresponds to a probe pattern in the base of the test fixture with sufficient spacing to accommodate high force spring probes capable of delivering substantially more spring force than the spring probes commonly used to test high density test point arrangements for loaded circuit boards. The fine pitch test pattern corresponds to a high density test point arrangement on the loaded PCB under test.

The translator fixture comprises at least a top translator plate and bottom translator plate both of which include holes. The holes in the top plate are arranged in a fine-pitch pattern, and the holes in the bottom plate are arranged in a wide-spacing pattern. The top translator plate is routed out to accommodate the components of the loaded board, or alternatively spacing blocks can be positioned on the top plate to elevate the UUT to accommodate the circuit board components. Tilt pins are positioned between the translator plates, approximately perpendicular to the translator plates, where the bottom end of each tilt pin passes through the holes in the bottom translator plate and the top ends of the tilt pins extended into holes in the top translator plate and are flush with the top surface of the top plate, or extend there beyond when blocks are used. The top ends of the tilt pins contact the test points on the circuit board under test and the bottom ends contact the spring probes in the base of the test fixture. The spring probes are also electrically connected to an external electronic test analyzer.

A mechanical, pneumatic or vacuum pressure is applied to the test fixture, the high force spring probes apply force to the tilt pins in the translator fixture which is translated to the test points. The force translated from the high force spring probes provide good electrical contact between the tilt pins and the test points which is particularly important in the case of high density test points. The loaded board test fixture of the present invention further includes optimization software that provides the shortest interconnect distance in the x-y plane eliminating most, if not all of necessary manual wiring. The optimization software includes a translator pin mapping algorithm process which considers the property of the individual pins. Such properties would include, but not be limited to, analog signal, digital signal, power supply, ground, peripheral, ASRU, resistor termination, test jet, polarity check or any other discerning characteristic. The optimization software also calculates the position of the loaded board location and rotation on the top of the translator fixture for optimal manufacturing time and cost with respect to the properties of the translator pins. The optimization software further includes a sizing algorithm which determines the optimal pin diameter and length based upon application, pin angle and loaded board contact characteristics.

The invention in another embodiment provides for the translator fixture to be located on top of an adapting unit that allows translation of the electrical signals from the rigid pins to the electronic test analyzer. The adapting unit can include a circuit board located between the spring probes of the electronic test analyzer and the highly spaced apart high spring force test probes. The circuit board is designed to allow a connection of peripheral circuits or devices. In yet another embodiment, the test fixture of the present invention can incorporate additional test devices such as an unpowered opens tester. The probes attached to the unpowered opens device are similarly tilted through holes in the parallel plates of the translator fixture. The probes attached to the unpowered opens tester are dropped down vertically into a block attached to one of the parallel plates of the translator fixture.

These and other features and advantages of the present invention would be better understood with reference to the following detailed description and the accompanying drawings.

BRIEF DESCRIPTION OF THE DRAWINGS

FIG. 3a is a top view of a top plate of the translator fixture of FIG. 2;

FIG. 3b is a bottom view of the translator fixture of FIG. 2;

FIG. 4 is a fragmentary schematic side elevational view of an alternate test fixture embodiment incorporating helix probes;

FIG. 5 is a fragmentary schematic cross-sectional view of a second alternative embodiment test fixture incorporating a short-wire interface panel;

DETAILED DESCRIPTION

Figure 1:
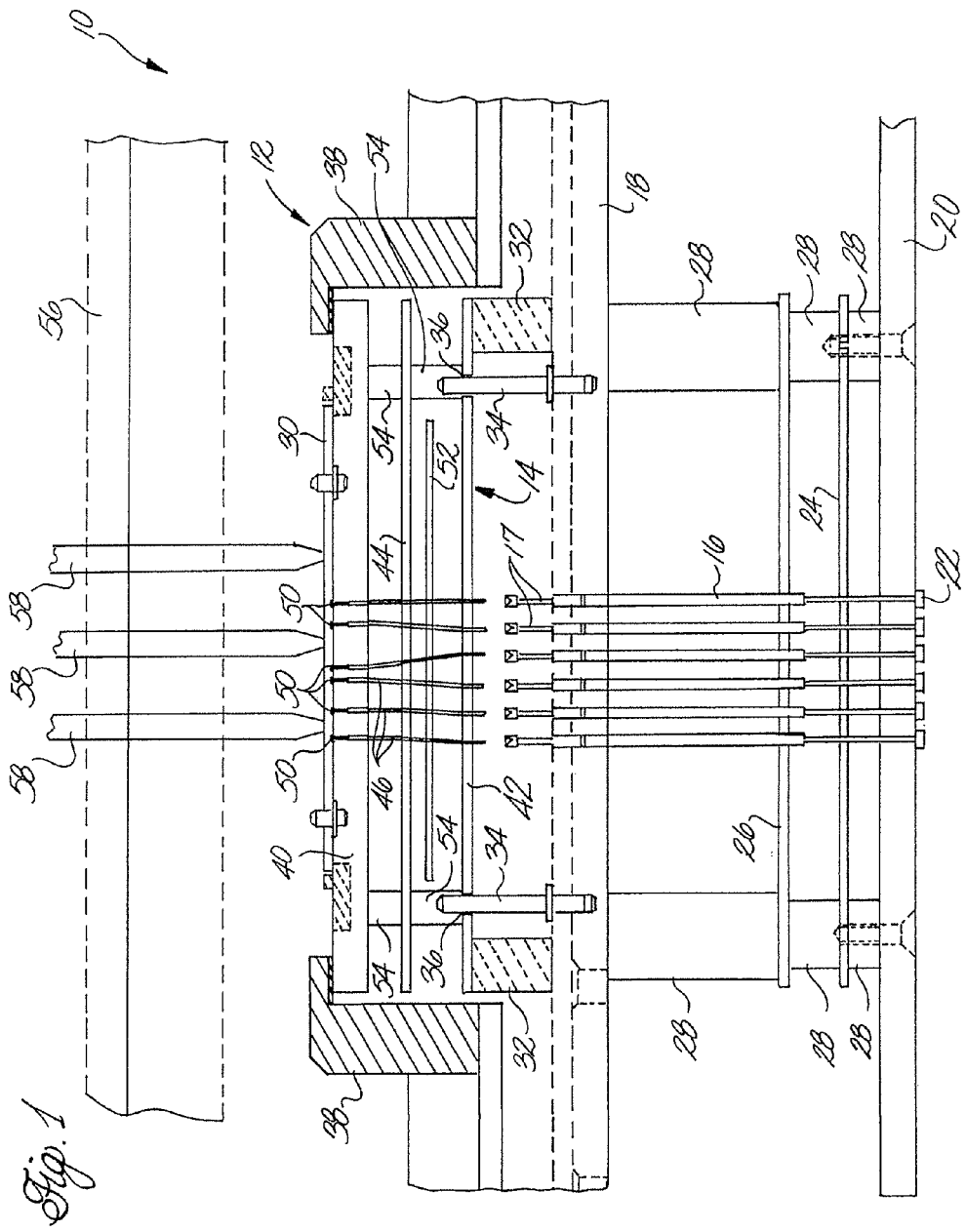
FIG. 1 is a fragmentary, schematic cross sectional view of a loaded board test fixture of the present invention.

FIG. 1 illustrates a loaded board test fixture 10 in accordance with the principals of this invention. The test fixture is principally used to align a printed circuit board in a test position for use with an electronic test analyzer. The invention is particularly useful in the testing of loaded circuit boards as distinguished from bare boards. In one example, the test fixture 10 comprises a vacuum test fixture 12 and a translator fixture 14 removably positioned within the vacuum fixture. The vacuum fixture includes a plurality of electronically conductive spring probes 16 positioned in corresponding holes in a non-conductive upper probe plate 18 located in the fixture. The spring probes are arranged in a hole pattern sufficiently far apart to accommodate spring probes, preferably spaced apart 100 mils on center. The 100 mils spring probes should be able to deliver a sufficient spring force in a range from about 4 to about 16 ounces. Typical 100 mil spring probes are made from beryllium cooper alloy and include an outer receptacle, a barrel in the outer receptacle, a plunger 17 projecting from the barrel, and a compression spring inside the barrel for applying a biasing force to the plunger which reciprocates outside the barrel under spring pressure in a well known manner.

Spring probes extend downwardly through a non-conductive base 20 of the vacuum fixture where terminals 22 at the bottom ends of the spring probes are electrically connected to an external electronic test analyzer. Intermediate probe plates 24 and 26 are positioned between the base 20 of the fixture and the upper probe plate 18 for guiding the spring probe 16. Individual spacers 28 are located between the base 20 and the upper probe plate 18 for positioning the intermediate probe plates 24 and 26. Holes are drilled in plates 24 and 26 for the passage of the spring probes 16, which are aligned parallel to one another, preferably in vertical axes uniformly spaced apart in two-dimensional rows across the fixture.

The translator fixture 14 is positioned in the vacuum fixture 12 corresponding to the location of high density test points on a loaded printed circuit board 30 which is tested by the fixture 10 and test electronics. The translator fixture 14 is suspended above the upper probe plate 18 and the vacuum fixture by support pads 32 positioned on the upper surface of the probe plate 18. Support pads 32 are preferably made from an elastic material. Metal guide post 34 are also positioned in the probe plate for aligning the translator fixture, and they extend upwardly through holes 36 in the bottom of the translator fixture. The translator fixture is held against the support blocks 32 and on the guide posts 34 by housing 38 which extends around the parameter of the top surface of the translator fixture.

Figure 2:
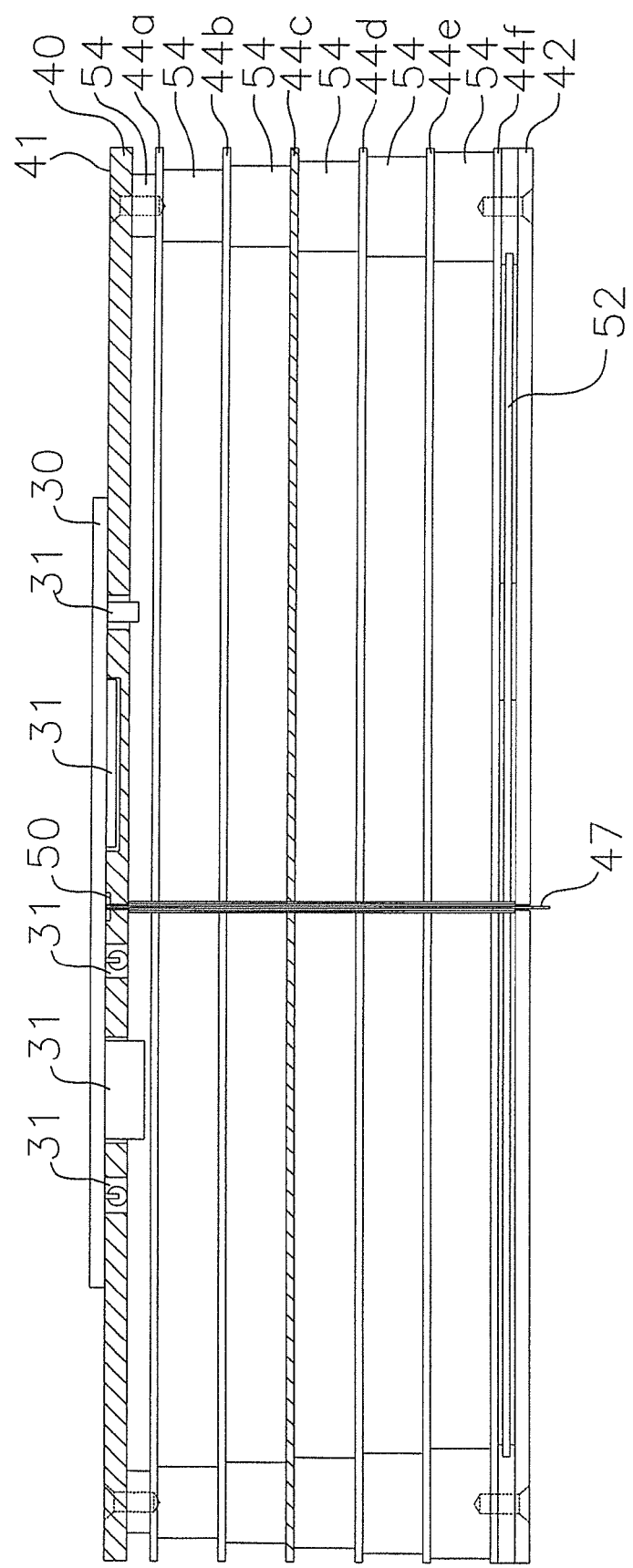
FIG. 2 is a schematic side elevational view of a translator fixture of the loaded board test fixture of FIG. 1.

The translator fixture comprises an upper translator plate 40, a lower translator plate 42 and an intermediate translator plate 44. Although the translator fixture is illustrated in FIG. 1 as having three translator plates, it is to be understood that any number of plates can be incorporated into the translator fixture as required for a particular application. FIG. 2, for example, illustrates a translator fixture with 6 intermediate plates 44a-f.

Flexible solid translator pins 46 are arranged approximately perpendicularly between the top translator plate and the bottom translator plate. Preferably solid non-flexible tilt pins 47, one of which is shown in FIG. 2 for simplicity, are utilized as the translator pins. The tilt pins 47 can be insulated and grounded to eliminate any interference between individual pins. Insulating and grounding is accomplished by shielding the tilt pins in a nylon tube 49 and then grounding the shielded pin by a combination of a metal tube 51 around the nylon tube and making one intermediate translator plate, such as plate 44c metal.

The translator plates have guide holes 48 as shown in FIGS. 3a and 3b with diameters large enough to allow the translator pins to freely pass through the plates. The bottom ends of each tilt pin 47 extend beyond the bottom surface of the bottom translator plate 42. The top ends of tilt pins 47 are flush with the top surface of the top plate 40 or alternatively can extend beyond the top surface of the top plate if spacer blocks are utilized for the printed circuit board under test.

Holes 48 (FIG. 3a) in top plate 40 are arranged in the high density pattern corresponding to the pattern intensity of test points on the loaded printed circuit board. Holes 48 (FIG. 3b) in bottom plate 42 are arranged in a uniform grid pattern corresponding to the array of spring probe 16 in the vacuum fixture 12. Tilt pins 46 translate electrical test signals from the test locations 50 on a lower surface of the printed circuit board 30 to the spring probes 16. The top surface 41 of translator plate 40 is routed to accommodate components 31 of board 30 so that test pads 50 are flush with surface 41 at the top ends of the tilt pins. By routing top plate 40 extreme accuracy between tilt pins 47 and test pads 50 is achieved because the top plate continually guides the tilt pins.

Tilt pins 46 are retained within the translator fixture by a latex pin retention sheet 52 positioned between the bottom translator plate 42 and intermediate translator plate 44. Separate spacer elements 54 are positioned between the translator plates to maintain their position.

As seen in FIG. 1, a hold-down gate 56, of vacuum fixture 12, includes downwardly projecting fingers 58 which contact the upper surface of the printed circuit board and hold the printed circuit board against the top translator plate 40 of the translator fixture. A vacuum is applied to the interior of the test fixture during testing to also maintain contact of the printed circuit board in the test fixture. The vacuum created within the fixture causes the spring loaded test probes in the probe plate to impose an upward force to the bottom ends of the tilt pins in the translator fixture, this force is translated to the top ends of the tilt pins which are in contact with the test points on the bottom surface of the printed circuit board. The tilt pins are sufficiently rigid axially that they retain compliant high spring pressure applied through the spring probes during the test cycle. The intermediate translator plates help guide the tilt pins as they contact the circuit board.

An advantage achieved by the present invention is that the vacuum test fixture can be used to test various circuit boards with different test point patterns corresponding to the test points on the circuit board. The advantage is realized by providing a translator fixture which can be easily removed and replaced with separate translator fixtures. This avoids the need to rearrange the spring probes and the vacuum fixture or rewire the spring probes.

Another advantage of the invention is the ability to produce a high pitch density of tilt pins at the top of the translator fixture for contact with the high density pattern of test points on the loaded board under test. Pins with as small as 10 mil spacing at the top of the translator fixture are possible. Spacing below 50 mils on center is considered a high pitch density with standard loaded boards. The 100 mil spring probes provide high spring force and the resulting spring compliancing necessary for testing.

FIG. 4 illustrates an alternative to the embodiment of the invention in which helix probes 60 are used in place of conventional 100 mil spring probes. Typical helix probes are those disclosed in Applicant's U.S. Pat. No. 5,032,787, the disclosure of which is incorporated herein by reference. The helix probes rotate under compliance spring pressure as the plunger 62 of the probe is forced downwardly into the outer barrel. The helix probes contact the bottom of individual tilt pins 46 in the translator fixture, and the tilt pins are rotated about their axis when the downward force is applied during testing. The purpose of rotating the tilt pins is to produce good twisting contact between the tip 64 of the pin and the test point 50 on the printed circuit board 30. Helix pins are particularly useful in addressing the problems of test pads that are dirty because of fluxes used in producing loaded circuit boards which are not cleaned by normal cleaning methods. The use of helix probes provides good twisting contact for the high density test points and allows the use of tilt pins that are made of stainless steel which are harder and more durable pins that stay sharper longer.

A second alternative embodiment of the invention is illustrated in FIG. 5. FIG. 5 illustrates the use of the invention in a short-wire test fixture 70. Previously, it has been difficult to align pins in a short-wire panel at the bottom of the fixture with tilt pins that contact the test points of the printed circuit board. In the present invention, the alignment problem is avoided by incorporating a short-wire interface panel in the bottom of the fixture 70 below the probe plate 74. The short-wire panel has pins 76 arranged below double-ended spring loaded test probes 78 carried in the probe plate 74. The pins 76 and the short-wire panel contact the bottoms of the double-ended spring probes which can be high spring force probes. Tilt pins 80 in the translator fixture engage the tops of the double-ended probes and can be angled to make necessary contact with the test point pattern on the board under test.

The short-wire interface panel has fixed pins 82 below the probes 78 which are hard wired 84 to the standard interface pins 86 at the peripheral of the short-wire interface panel 72. An external electronic test analyzer makes contact with the standard interface pins for conducting the test. The fixture 70 incorporates the translator fixture in combination with the double-ended spring probes and the short-wire interface panel to provide proper alignment between the pins and short-wire interface panel and the tops of the translator pins and make contact with the test points on the circuit board. The double-ended probes that are short-wired are those that do not align directly over the grid of the tester interface. In a short-wire fixture, the probes cannot be moved around on the probe plate. However, the translator fixture solves this problem by translating the position of the spring loaded probe to the desired test points on the printed circuit board by way of the tilt pins. Alternatively, a printed circuit board can be utilized as the interface panel for the electronic testing analyzer instead of a short-wire interface panel which would eliminate wiring in interface panel and would incorporate pads instead of pins.

Figure 6:
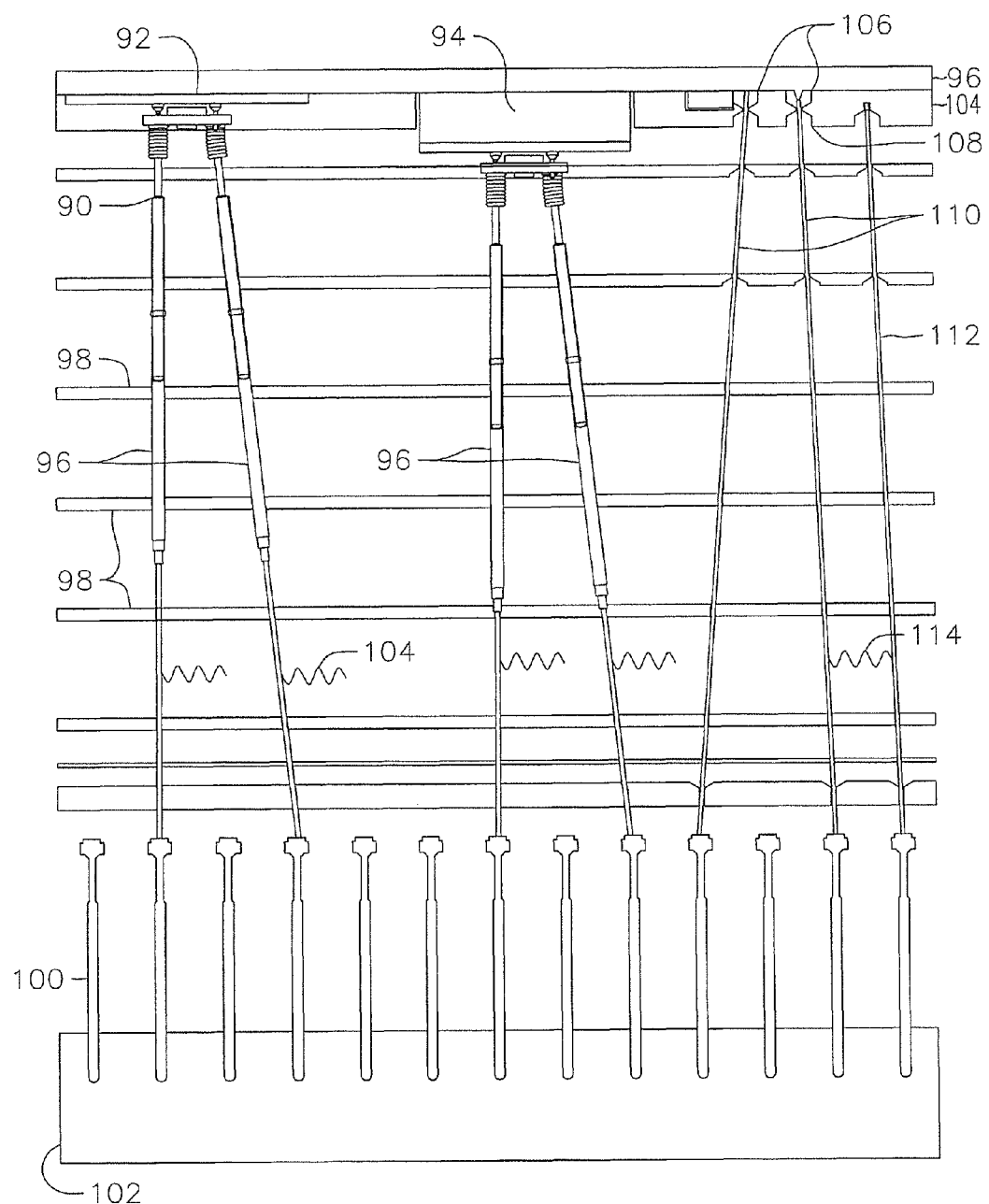
FIG. 6 is a fragmentary schematic side elevational view of another alternative test fixture embodiment incorporating an unpowered opens device or blind pins.

FIG. 6 illustrates yet another alternative embodiment of the present invention which incorporates an unpowered opens device 90 within the translator fixture to test components 92, 94 on the unit under test 96. The unpowered opens device includes spring probes 96 which extend through holes in the individual translator plates and engages the spring probes 100 in the automatic test equipment interface 102. Spring probes 96 can include wires 104 which would extend to unpowered open cards for transmission of test signals. The top plate 104 includes openings or recesses to accommodate components 92 and 94 and also can include recesses 106 and 108 on both a top and bottom surface to create a web therebetween for more precise guiding of the tilt pins 110. The fixture illustrated in FIG. 6 also includes the use of one or more blind pin 112 which does not extend all the way through top plate 104 to balance lateral forces or provide a connection to a specific interface pin via a wire 114.

Figure 7:
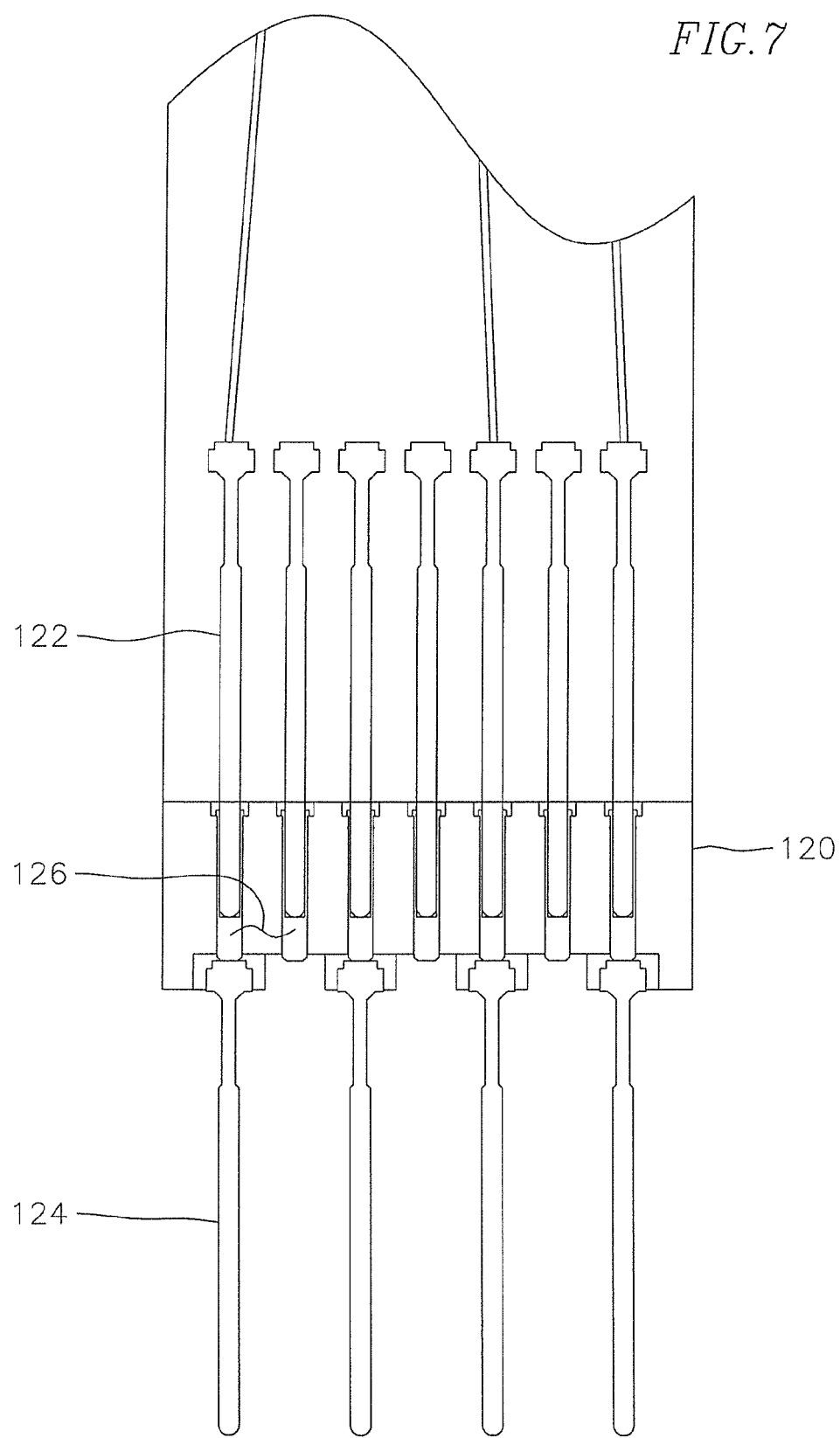
FIG. 7 is a fragmentary schematic cross-sectional view of another alternative embodiment test fixture incorporating a multiplexing adapter.

FIG. 7 illustrates another alternative embodiment test fixture incorporating the use of a multiplexing adapter 120. The multiplexing adapter includes a more dense set of spring probes 122 to increase the density of the spring probes 124 in the automatic test equipment interface. Spring probes 122 can be wired 126 together so that two probes are available to connect to an individual spring probe 124 in the automatic test equipment interface thereby increasing the density.

Figure 8:
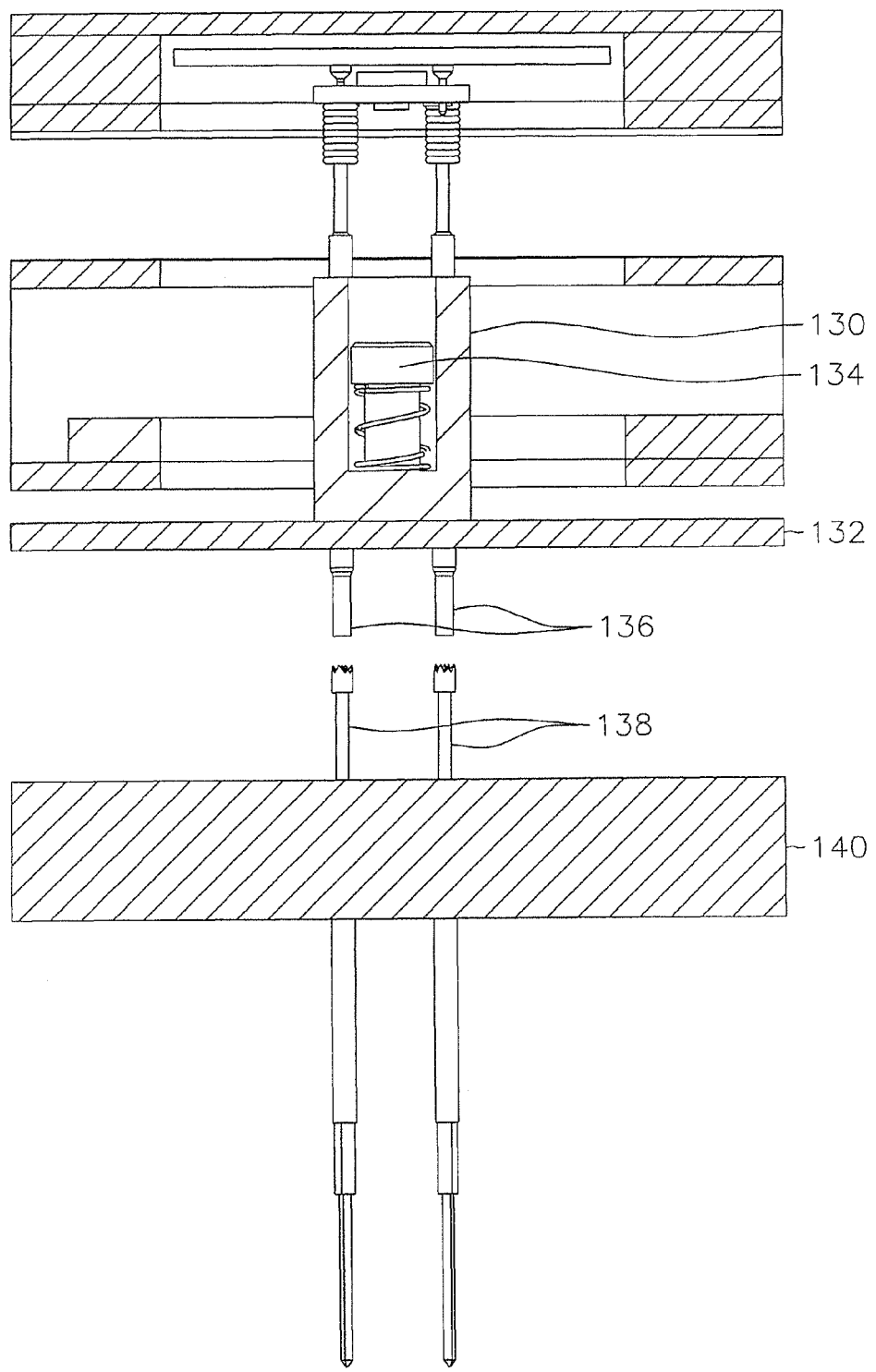
FIG. 8 is a schematic cross-sectional detail view of an alternative unpowered opens device.

FIG. 8 illustrates an alternative embodiment unpowered opens device for testing components on the unit under test. The unpowered opens device includes a set block 130 which is attached to the bottom translator plate 132 by a shoulder screw 134 or other similar fastener. The set block incorporates receptacles 136 which contacts spring probes 138 in the automatic test equipment interface 140. The receptacles 136 contact the spring probes 138 when the translator fixture moves down. Alternatively the set block is attached to a secure plate separate and below the translator fixture preset to the appropriate height for testing components on the UUT, or can have test probes below to push the device up through the set block and against the components for testing.

Figure 9:
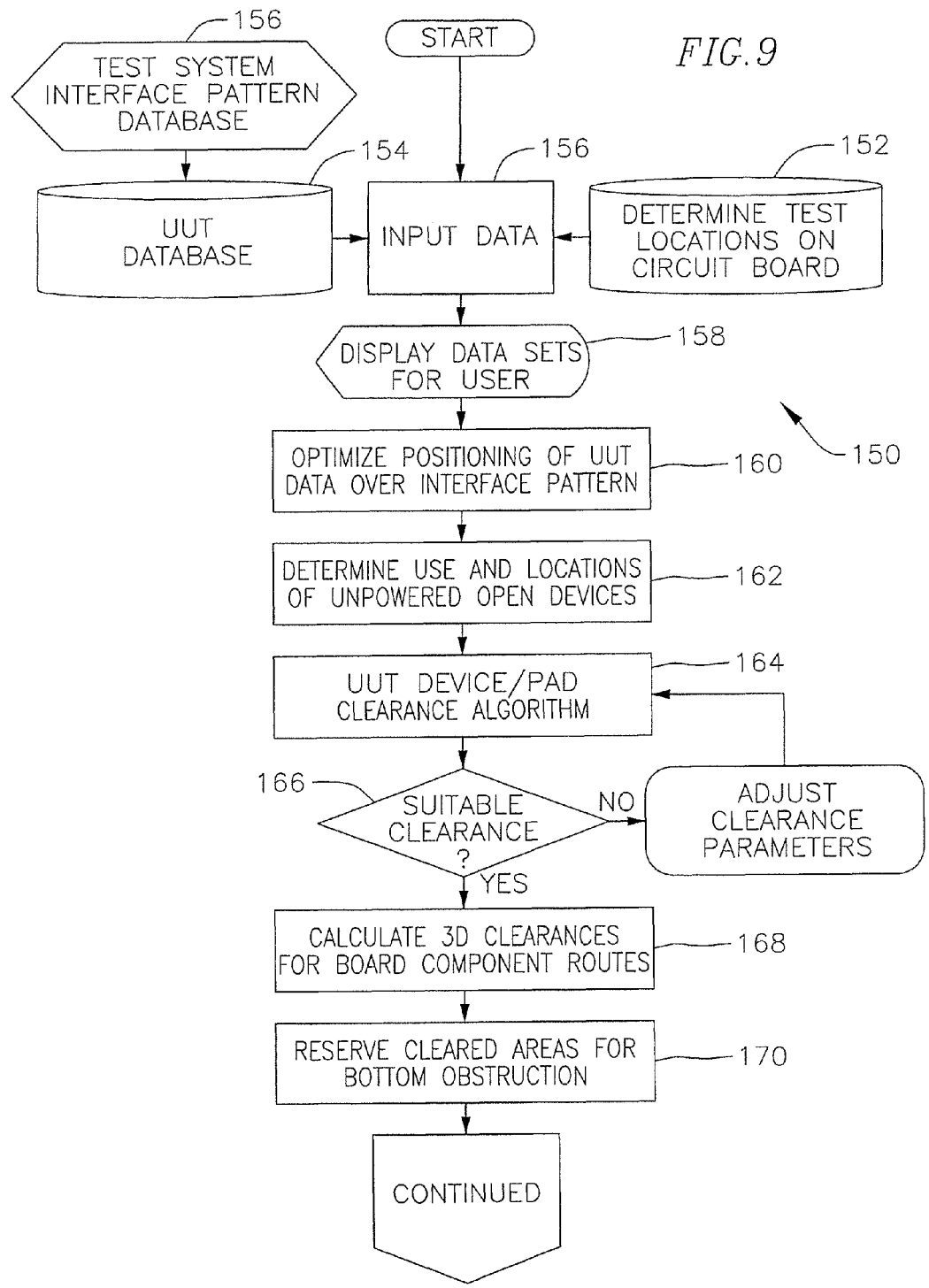
FIG. 9 is a flow chart illustrating the translation optimization software of the present invention.
Figure 9:
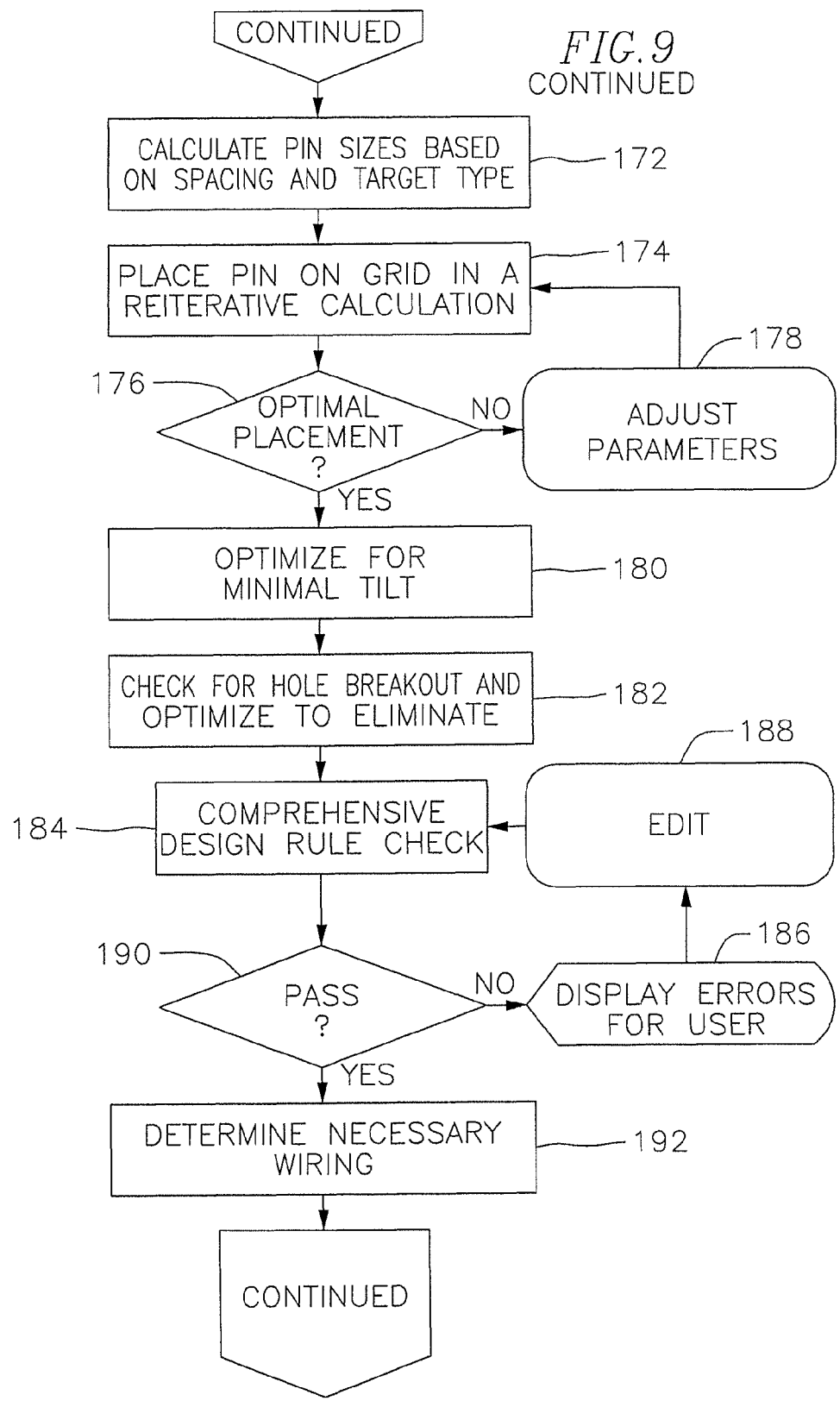
Figure 9:
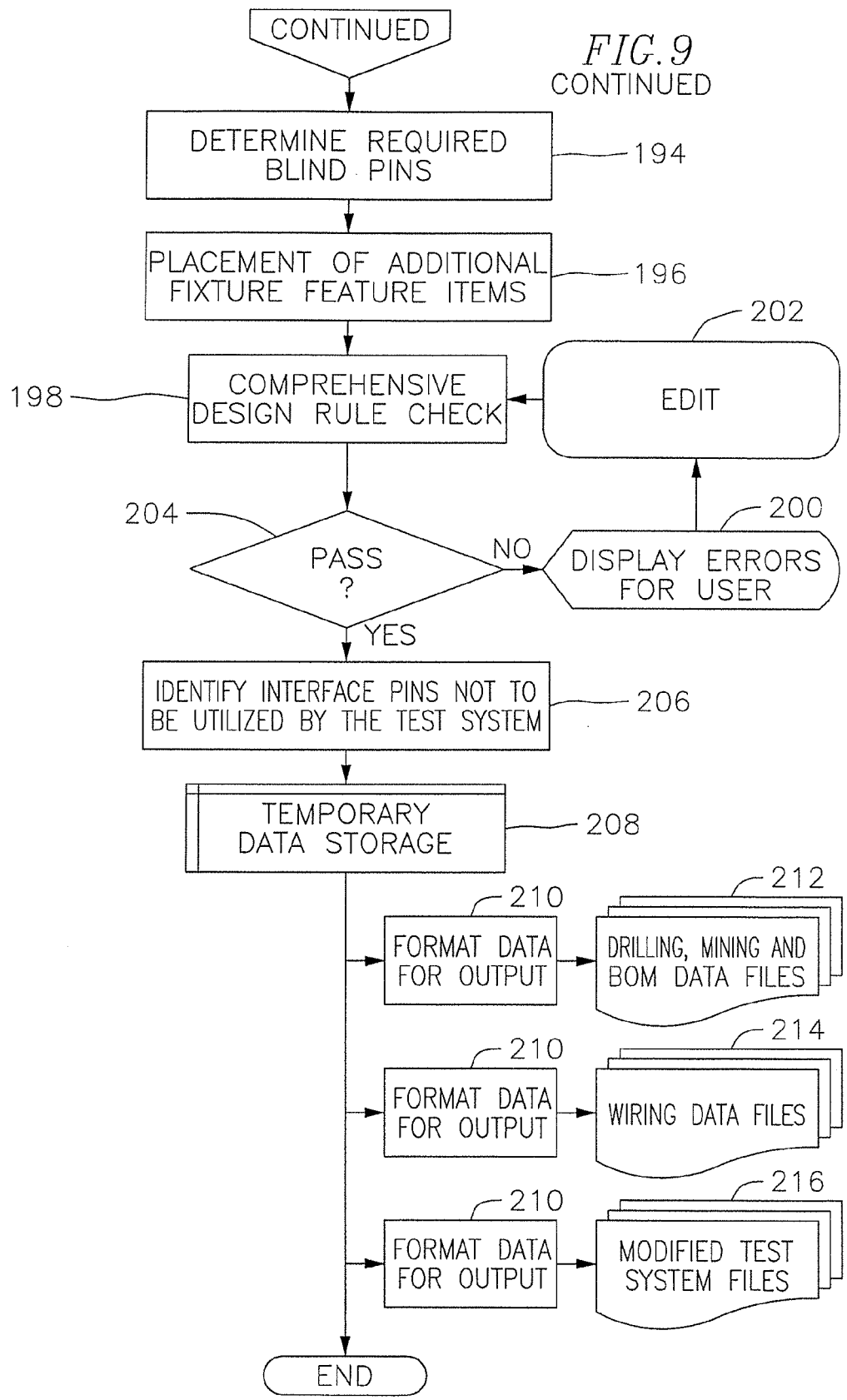

The test fixture of the present invention is designed and manufactured through the use of an optimization software that provides the shortest interconnect distance in the x and y planes while minimizing manual wiring and reducing the manufacturing time from weeks to days or hours. The test fixture of the present invention includes a computer program 150 as shown in FIG. 9. Software algorithms are employed to locate the final drilling locations of the parallel plates in the translator fixture, final wiring data for the fixture, and additional test system files required for properly testing the loaded circuit board, also referred to as the unit under test (UUT). The test system files are unique for each manufacturer and model of automatic test equipment, such as for example Agilent 3070, Genrade 228x or Spectrum 800x, and that interface pattern database 152 is interpreted automatically into a common data format for the software to utilize. Fixture software programming is performed to the database for the UUT 154. This data results in the test locations on the printed circuit board 156 and initial drill locations on the top plate for testing the unit under test. The software inputs this data 156 and displays the datasets to the user 158 in a graphical format throughout the process. Using the data and test system interface pattern database, the location of the UUT is optimized over the interface pattern 160.

As indicated above, an unpowered opens device can be employed to test components of the circuit board. Additional resources and physical space are required for the use of such devices and they can be manually or automatically sized appropriately and located to the necessary area of testing. The software 162 must locate the device, analyze available resources, and either use a stationary block or tilt the probes of the unpowered opens device appropriately to reach an available spring probe. Once located, the affected parallel plates have drilling and pocket milling calculated. Drilling and pocket milling are required to allow the UUT to sit on or above the adjacent fixture plates. Any component that protrudes from the UUT must be analyzed and milled for in the adjacent plate 164. The UUT may sit directly on the adjacent plate or raised above the plate by a specified distance 166. Raising the UUT reduces the amount of milling required but also has a large impact on the locations for the drilled holes that guide the tilt pins to the test points on the UUT. On some cases the plate adjacent to the UUT is coated with an electrostatic discharge layer. If this layer is present and if the UUT is sitting directly on the plate, additional spot face drilling is required on this plate to prevent exposed pads on the UUT from shorting.

Clearances in three dimensions, namely x, y and z, are calculated 168 for drilling and pocket milling. These clearances are used to restrict pin sizes and avoid interferences. Additionally, there are possible obstructions in the bottom of the fixture near the tester interface which must be accounted for. These obstructions are identified and appropriate pocket milling and loss of tester resources are calculated 170 by the software. Additionally, any further restrictions identified by the fixture software design algorithms in the usual steps are calculated and reserved in this step.

For each test location on the UUT, a pin is assigned and sized 172 appropriately with respect to the UUT database 154. Contact characteristics create initial sizing of the pin and then optimal diameter and length are chosen based on application and spacing between targets and between pin shafts. The software determines 174 placement on the grid in a reiterative calculation by checking for optimal placement 176 and adjusting parameters 178.

The pin mapping algorithm 174 is performed to assign test point locations to the closest or optimal pin in the interface pattern. This one-to-one mapping represents an angled pin connecting a PCB test location to an interface pin. The initial angling of these pins is performed in such a way as to minimize the lateral x and y directional forces. Furthermore, the mapping will also take into consideration the properties of each interface pin. Such properties would include, but not be limited to analog signal, digital signal, power supply, ground, peripheral, ASRU, resistor termination, test jet, polarity check, unpowered opens or any other discerning characteristic. This mapping algorithm also contains logic to ascertain if the pins of a multiplex nature are in use, and avoid the multiple uses of any multiplex pins. Within the tester or adapter, some pins are considered multiplexed if they are electrically connected and cannot both be used at the same time. Additionally, the algorithm can be used in conjunction with a test system interface pattern alone or with the adaptor pattern specific to a multiplex pattern and can eliminate interferences with respect to the multiplexing of the test system. The placement is analyzed to be optimal 176 and if not, auto-adjust parameters 178 are utilized and the placement is adjusted.

The pins are then analyzed 180 for their tilt angle. A minimum of angle is desired and pins are swapped on their tester resources within the prior restrictions to achieve the minimum tilt angle. The pin mapping algorithm also takes into account any pocket milling or drilling assigned from the prior step of placing the UUT on the adjacent fixture plates. If any pins cause a breakout, they are re-analyzed and optimized again to eliminate 182 the breakout. The pin mapping algorithm also takes into account UUT device outlines and height to avoid conflict with any of the pins.

Once the best optimization is accomplished through the steps, every pin and interaction to the plates are analyzed against a list of design rules 184 that govern limitations to parameter that would include but not be limited to pin spacing, pocket spacing, break-out, pin angle, and target size. Within this process the automatic routines determine optimal placement and sizing of the holes within the plates based upon the size and tilt of the rigid pins. Some of the specific drill entities would include but not be limited to perpendicular or angled circular drilling into the plates, counter bores in plates to reduce the friction of pins, and counter bores in plates to assist in pin guiding during assembly. Counter bores in both sides of the plate adjacent to the UUT are added. This provides a very small web of material to provide the most accurate guiding feature for the pin. The vertical location of the web can be adjusted automatically or manually for each pin based on the nearby pocket milling required for component clearances. The closer the web is to the UUT the more accurate the targeting of the rigid pin to the UUT.

Once any errors 186 are manually or automatically resolved 188 through alternate routines, the data 190 is ready to be used for determining the necessary manual wires 192. In this step, an automated process will determine the need for manual wires based upon initial connection data and test system capabilities. Manual wires are used to connect pins of any style together as required for the test. A pin may have any number of wires affixed to it, or none at all. Some fixtures may not require any manual wires.

The software performs an automated process to determine the need and placement for blind pins 194 based upon manual wiring and/or lateral forces. Blind pins do not make direct contact with the UUT and have two functions; to balance lateral forces and/or to provide a connection to a specific interface pin via a wire. Thus, if in the event a specific pin type from the UUT cannot reach an available resource, a blind pin would be utilized at a nearby resource and wired to the pin that can contact the UUT at the necessary location. Blind pins with wires attached can also be utilized to connect interface jumpers, probe jumpers, or specific interface pins that cannot be remapped such as ASRU and control pins. Blind pins may or may not have wires attached to them and can be tilted like regular pins.

Other features necessary within the UUT area to construct the fixture are added manually, or automatically through the software 196. These include but are not limited to structural supports, finger clearances for UUT removal, pins to cage the UUT, and blocks that raise the UUT above the adjacent plate.

Every pin and interaction to the plates are again analyzed 198 against a list of design rules that govern limitations to parameters that would include, but not be limited to, pin spacing, pocket spacing, break-out, pin angle, and target size. Within this process the automatic routines determine optimal placement and sizing of the holes within the plates based upon the size and tilt of the rigid pins. This is repeated in the event any pins were moved or adjusted based on adding the blind pins or other features. Errors are displayed 200 and edited 202 until passing 204 the design rules.

The software includes an automated process 206 to determine the need to disable resources on the test system based upon initial connection data. In some instances a pin may need to contact the UUT but direct electrical connection to the mapped interface pin is not desired. Test pins with this requirement will still tilt to an interface pin, but only to take advantage of its spring force. This is to insure good contact to the UUT. Usually a manual wire is connected to this type of pin, but is not required. An electrically insulated pin or an insulated cap may also be used on the rigid pin to prevent electrical connectivity based upon test system capabilities.

Once any errors are manually or automatically resolved through alternate routines, the data is ready to produce the necessary outputs to manufacture the fixture. The data can be placed in a temporary data storage 208 and is in a state to be stored permanently and formatted for output 210 for recall and reproduction of the manufacturing information. Bill of material, numerical control drilling data for both milling and drilling each of the plates 212, manual and automatic wiring data files 214, and specific test system files 216 are output. The test system files provided at the beginning of the process contain very specific test resources used for testing the circuit board. Because of the rigid pin location and optimization routines, these tester resources are modified. This process translates the new resources required back into the test system instructions. These reassigned test instructions are returned to the test program used in the automatic test equipment to test the circuit board. This particular step is unique for each manufacturer and model of automatic test equipment.

Although the present invention has been described and illustrated with respect to specific embodiments thereof, it is to be understood that the invention is not to be so limited since changes and modifications can be made therein which are within the full and limited scope of the invention is hereinafter claimed. For example, one embodiment illustrates the fixture with respect to a vacuum fixture, however, the translator fixture can be pressed onto the electronic test analyzer by other external devices such a pneumatic or mechanical. The test fixture can be designed to allow for connection of peripheral circuits or devices that interact with the electronic test analyzer. In addition the invention has been described with respect to the testing of electronic devices in a bed of nails style of tester, however, the invention can be used for operating electronic devices where extensive connections are not desired.

What is claimed is:

1. A loaded board test fixture for testing a plurality of closely spaced test points on a loaded printed circuit board comprising:

an array of relatively widely spaced apart high spring force test probes extending through a probe plate and adapted for electrically connecting to an external electronic test analyzer;

a translator fixture removably positioned over the high spring force test probes and adjacent the closely spaced test points on the circuit board;

the translator fixture having a top plate for receipt of circuit board components so that an upper surface of the top plate is substantially adjacent to the test points on a loaded printed circuit board and a plurality of parallel plates below the top plate;

a plurality of translator pins supported in the translator fixture for alignment with the test probes at one end of the translator fixture and with the closely spaced test points at the opposite end of the translator fixture, the translator pins comprising solid pins having sufficient axial rigidity to effectively translate test forces applied by the test probes to the closely spaced test points, and wherein the test probes are in compliant contact with the translator pins for translating said test forces and electrical test signals between the closely spaced test points on the printed circuit board and connections to the external electronic test analyzer; and optimization means that determines the placement of the translator pins in the translator fixture by determining final hole drilling locations in the top plate and plurality of parallel plates based upon the shortest interconnect distance between the closely spaced test points and the test probes for the translator pins.

2. The test fixture of claim 1 wherein the optimization means is computer software.

3. The test fixture of claim 1 further comprising an unpowered opens device positioned within the translator fixture for electrically translating test signals from loaded circuit board components to the test probes.

4. The test fixture of claim 1 further including a multiplex adapter within the test fixture between the translator pins and the test probes.

5. The test fixture of claim 1 wherein the translator fixture further includes at least one force applying blind pin.

6. The test fixture of claim 1 wherein the translator fixture further includes a plurality of spaced apart translator plates wherein the translator pins extend through holes in the translator plates.

7. The test fixture of claim 6 wherein at least one translator plate has a recess in a top surface and recess in a bottom surface creating a web having a hole for guiding a translator pin.

8. The test fixture of claim 3 wherein the unpowered opens device has a set block fastened to a bottom translator plate in the translator fixture.

9. The test fixture of claim 5 wherein the translator fixture has at least two translator pins wired together.

10. A method for determining an optimized translation of translator pins within a translator fixture between test locations on a loaded printed circuit board under test and tester interface locations comprising the steps of:

determining drilling and pocket milling requirements for properly positioning the loaded printed circuit board under test on the translator fixture;

the drilling requirements including determining final hole drilling locations through multiple parallel plates in the translator fixture based upon the shortest interconnect distance between the test locations and the tester interface locations;

performing a pin mapping algorithm to assigned test point locations for the loaded printed circuit board under test to the tester interface locations by angling translator pins in such a way as to minimize lateral and directional forces; and performing a pin sizing algorithm to automatically determine optimal translator pin diameter and length.

11. The method of claim 10 wherein the pin mapping algorithm determines interface properties including analog signal, digital signal, power supply, ground, peripheral, ASRU, resistor termination, test jet or polarity check.

12. The method of claim 10 wherein the pin sizing algorithm determines the optimal translator pin diameter and length based upon application, pin angle and test locations characteristics.

* * * * *